United States Patent
Meholensky et al.

(10) Patent No.: US 10,483,986 B1
(45) Date of Patent: Nov. 19, 2019

(54) PHASE ALIGNING PHASE LOCKED LOOP (PLL) CIRCUIT

(71) Applicant: Rockwell Collins, Inc., Cedar Rapids, IA (US)

(72) Inventors: Michael C. Meholensky, Marion, IA (US); Robert D. Pond, Cedar Rapids, IA (US)

(73) Assignee: ROCKWELL COLLINS, INC., Cedar Rapids, IA (US)

( * ) Notice: Subject to any disclaimer, the term of this patent is extended or adjusted under 35 U.S.C. 154(b) by 0 days.

(21) Appl. No.: 16/135,508

(22) Filed: Sep. 19, 2018

(51) Int. Cl.
| | | |
|---|---|---|
| *H03L 7/093* | (2006.01) | |
| *H03L 7/08* | (2006.01) | |
| *H04L 7/04* | (2006.01) | |
| *H04B 3/462* | (2015.01) | |
| *H04L 7/02* | (2006.01) | |

(52) U.S. Cl.
CPC .............. *H03L 7/08* (2013.01); *H04B 3/462* (2013.01); *H04L 7/02* (2013.01); *H04L 7/04* (2013.01)

(58) Field of Classification Search
CPC ..... H03L 7/06; H03L 7/08; H03L 7/16; H03L 7/0802; H03L 7/0805; H03L 7/0807; H03L 7/083; H03L 7/095; H04L 7/033; H04L 7/0331; H04L 7/0016; H04L 7/02; H04L 7/04; H04B 3/462
See application file for complete search history.

(56) References Cited

U.S. PATENT DOCUMENTS

| | | | | |
|---|---|---|---|---|
| 4,389,622 | A * | 6/1983 | Kackman | H03L 7/0807 331/1 A |
| 6,693,987 | B1 * | 2/2004 | Hattori | H03L 7/0805 327/156 |
| 2012/0319747 | A1 * | 12/2012 | Namdar-Mehdiabadi | H03L 7/095 327/149 |
| 2015/0207620 | A1 * | 7/2015 | Colby | H04L 7/0331 375/376 |
| 2016/0294401 | A1 * | 10/2016 | Jin | H03L 7/093 |
| 2017/0324419 | A1 * | 11/2017 | Mayer et al. | H03L 7/0891 |
| 2018/0006856 | A1 * | 1/2018 | Mukherjee | H03K 19/21 |

OTHER PUBLICATIONS

Vorhaus et al., "Monolithic Dual-Gate GaAs FET Digital Phase Shifter, IEEE transactions on Microwave Theory and Techniques", vol. MTT-30, No. 7, Jul. 1982. 11 pages.
"Phase Shifters", Microwaves101.com; 7 pages. https://microwaves101.com/encyclopedia/phase-shifters.

* cited by examiner

*Primary Examiner* — Dac V Ha
(74) *Attorney, Agent, or Firm* — Donna P. Suchy; Daniel M. Barbieri

(57) ABSTRACT

A signal phase aligning system includes a signal generator configured to generate a signal. The system further includes a phase locked loop circuit configured to generate a phase locked loop signal based on the signal generated by the signal generator. The system includes a phase aligning circuit configured to align a phase of the phase locked loop signal with a phase of the signal generated by the signal generator.

20 Claims, 7 Drawing Sheets

PHASE ALIGNING PHASE LOCKED LOOP (PLL) CIRCUIT

BACKGROUND

Embodiments of the inventive concepts disclosed herein relate generally to the field of phase locked loops (PLLs). More particularly, embodiments of the inventive concepts disclosed herein relate to PLLs for multiple systems, the systems requiring input signals that are in phase with each other.

PLLs are control systems (e.g., circuits, digital systems, etc.) where an input signal is aligned in frequency to an output signal based on a relative difference of phase between the input signal and the output signal, i.e., by keeping the phase between the input signal and the output signal locked. The PLL includes a loop by which the output of the PLL can be fed back into the PLL to be compared with the input to the PLL. PLLs can be utilized to step up or step down frequencies. Many systems, specifically in aircraft, rely on a signal generated by a PLL. However, while PLLs lock phase, they do not necessarily align phase nor do multiple PLLs align phase relative to each other. Therefore, for an aircraft, there may be multiple phase sensitive systems each receiving a signal generated at a particular frequency (or frequencies) but all out of phase. This can cause performance issues with phase sensitive systems.

SUMMARY

In one aspect, the inventive concepts disclosed herein are directed to a signal phase aligning system. The system includes a signal generator configured to generate a signal. The system includes a phase locked loop circuit configured to generate a phase locked loop signal based on the signal generated by the signal generator. The system further includes a phase aligning circuit configured to align a phase of the phase locked loop signal with a phase of the signal generated by the signal generator.

In a further aspect, the inventive concepts disclosed herein are directed to a signal phase aligning circuit. The circuit includes a signal generator circuit configured to generate a signal, a phase locked loop circuit configured to generate a phase locked loop signal based on the signal generated by the signal generator circuit, and a phase aligning circuit configured to align a phase of the phase locked loop signal with a phase of the signal generated by the signal generator circuit.

In a further aspect, the inventive concepts disclosed herein are directed to an integrated circuit. The integrated circuit includes a first phase locked loop circuit configured to generate a first phase locked loop signal based on a signal generated by a signal generator and a first phase aligning circuit configured to align a phase of the first phase locked loop signal with a phase of the signal generated by the signal generator. The integrated circuit further includes a second phase locked loop circuit configured to generate a second phase locked loop signal based on the signal generated by the signal generator and a second phase aligning circuit configured to align the phase of the second phase locked loop signal with the phase of the signal of the signal generator. The phase of the first phase locked loop signal is aligned with the phase of the second phase locked loop signal.

BRIEF DESCRIPTION OF THE DRAWINGS

Implementations of the inventive concepts disclosed herein may be better understood when consideration is given to the following detailed description thereof. Such description makes reference to the annexed drawings, which are not necessarily to scale, and in which some features may be exaggerated and some features may be omitted or may be represented schematically in the interest of clarity. Like reference numerals in the figures may represent and refer to the same or similar element, feature, or function. In the drawings.

DETAILED DESCRIPTION

Figure 1:
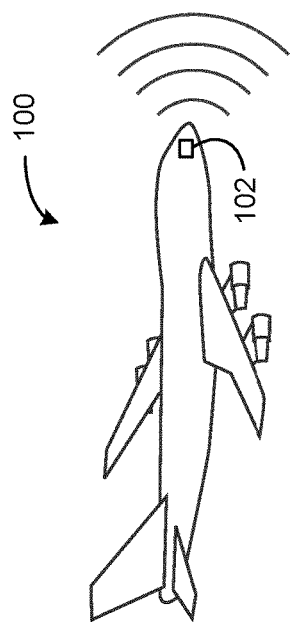
FIG. 1 is a perspective view schematic drawing of an aircraft with a phase sensitive system, according to exemplary aspects of the inventive concepts disclosed herein.

Before describing in detail the inventive concepts disclosed herein, it should be observed that the inventive concepts disclosed herein include, but are not limited to, a novel structural combination of data/signal processing components, sensors, and/or communications circuits, and not in the particular detailed configurations thereof. Accordingly, the structure, methods, functions, control and arrangement of components, software, and circuits have, for the most part, been illustrated in the drawings by readily understandable block representations and schematic diagrams, in order not to obscure the disclosure with structural details which will be readily apparent to those skilled in the art, having the benefit of the description herein. Further, the inventive concepts disclosed herein are not limited to the particular embodiments depicted in the exemplary diagrams, but should be construed in accordance with the language in the claims.

Referring generally to the figures, systems and methods for phase aligning signals of PLLs are described with respect to various aspects of the inventive concepts. PLL circuits can be used in electronics to generate high frequency signals. The PLL circuits can be up or down frequency converters, i.e., circuits that increase or decrease a signal frequency of a reference signal. The reference signal supplied to the PLL may be a local oscillator.

The output signal of the PLL circuit is not necessarily phase aligned with the input signal, i.e., the output signal and the input signal may be out of phase, even though locked. Furthermore, for multiple PLL circuits depending from the same LO, the signals generated by the PLL circuits may not be in phase with each other. To correct this phase issue in PLLs, based on the phase of the LO compared to the output of the PLL, a phase aligning circuit (e.g., a phase shifter circuit) can be configured to align the output phase to the input phase. A control signal can drive the phase aligning circuit and may be based on a phase detector circuit and/or a frequency divider circuit. The phase detector circuit and the frequency divider circuit may be the same components as used in the PLL and/or may be different components unique to the phase aligning circuit.

The PLL together with the phase aligning circuit can provide a tight alignment in phase between the phase of the signal generated by the LO and the phase of the PLL output signal. For this reason, multiple PLL circuit outputs can be aligned to each other by aligning them to a shared LO signal. This alignment in phase between multiple PLL circuits can enable multiple systems to each operate on a signal with the same phase. For avionics systems that are phase sensitive, such as phase arrays operating in any frequency range (e.g., mmWave phase arrays and above), beamformer digital arrays, active electronically scanned array (AESA) systems, passive electronically scanned array (PESA), and various other systems, phase alignment via the PLL circuit and phase alignment circuit combination can avoid poor system performance. Furthermore, utilizing a PLL together with a phase aligning circuit can reduce the complexity of frequency generating circuit. Furthermore, the phase aligning PLL circuits as discussed herein can reduce the cost for complex frequency generation circuitry for the aforementioned systems.

Referring now to FIG. 1 an aircraft 100 is shown including a phase sensitive system 102, according to an exemplary embodiment. The aircraft 100 is shown to be an airliner. However, aircraft 100 may be any kind of commercial aircraft, military aircraft, helicopter, unmanned aerial vehicle (UAV), spacecraft, car, truck, motorcycle, tank, Humvee, and/or any other kind of vehicle, manned or unmanned. The phase sensitive system 102 can be any kind of avionics system. For example, the phase sensitive system 102 may be a phase array system, e.g., an AESA radar system, a PESA radar system, a communication system (e.g., Satellite Communication, Optical Communication, Radio Communication, etc.), and/or any other type of phase sensitive system. The frequencies that the phase sensitive system 102 can be configured to operate in may be above 8 GHz (or below 8 GHz), e.g., in the 28-30 GHz range, the 60-70 GHz range, or any other frequency range The phase sensitive system 102 can be modular and include multiple components, each component driven by (or configured to utilize) its own clock and/or input signal. In some embodiments, for the phase sensitive system 102 to operate properly, the signal provided to each of the components must be in phase. If the signals are out of phase, the phase sensitive system 102 may cease to function or may not function properly or at a highest level of performance possible. In this regard, various circuits as described herein can be utilized to align the phase of the signals used to drive the various components to improve the performance of said components.

Figure 2:
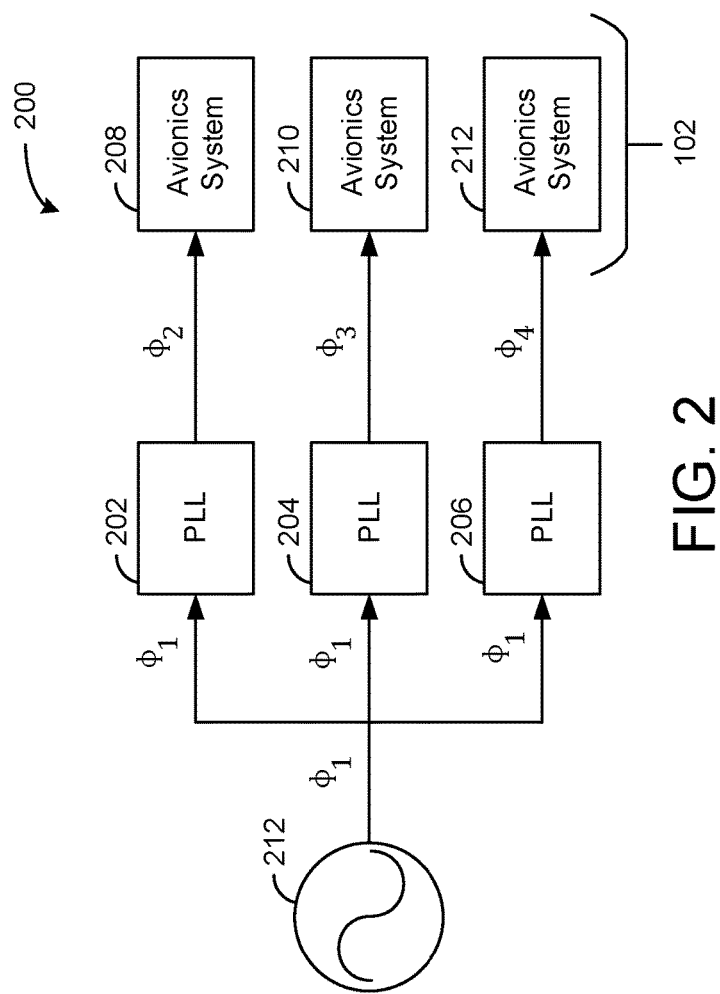
FIG. 2 is a circuit block diagram of a signal generator generating an input signal for multiple PLL circuits, each PLL circuit generating a signal with a different phase, according to exemplary aspects of the inventive concepts disclosed herein.

Referring now to FIG. 2, a circuit block diagram of a circuit 200 configured to generate signals for the phase sensitive system 102 as described with reference to FIG. 1 is shown, according to an exemplary embodiment. The circuit 200 includes a signal generator 212. The signal generator 212 can be a circuit including a crystal oscillator, a voltage controlled oscillator, and/or any other circuit or device configured to generate a signal, either an analog signal or a digital signal, at a particular frequency or frequencies.

The signal generator 212 can be configured to generate a signal at a particular frequency with a particular phase. The signal generated by the signal generator may be associated with a first phase, $\phi_1$. The signal is provided to one or multiple PLL circuits, PLL 202, PLL 204, and PLL 206. Although three PLL circuits are shown in FIG. 2, any number of PLL circuits can receive the signal generated by the signal generator 212. Each of the PLLs 202-206 can be configured to generate an output signal at a particular frequency with a particular phase. The output signal may be at the same frequency as the input signal, may be at a higher frequency, or may be at a lower frequency. The output of each of the PLLs 202-206 may be at a different phase than the signal generated by the signal generator 212. For this reason, the output of each of the PLLs 202-206 may be at different phases from each other.

The signal output by each of the PLLs 202-206 can be provided to avionics systems 208-212 of phase sensitive system 102. In some embodiments, avionics systems 208-212 are each integrated circuit chips, processors, processing circuits, or any other kind of component. Each of the avionics systems 208-212 can receive a signal generated by one of the PLLs 202-206. However, the signals can be of different phases, i.e., $\phi_2$, $\phi_3$, and $\phi_4$. Since each of the phases are different for the avionics systems 208-212, the performance of phase sensitive system 102 may be poor and/or phase sensitive system 102 may cease to function properly.

Figure 3:
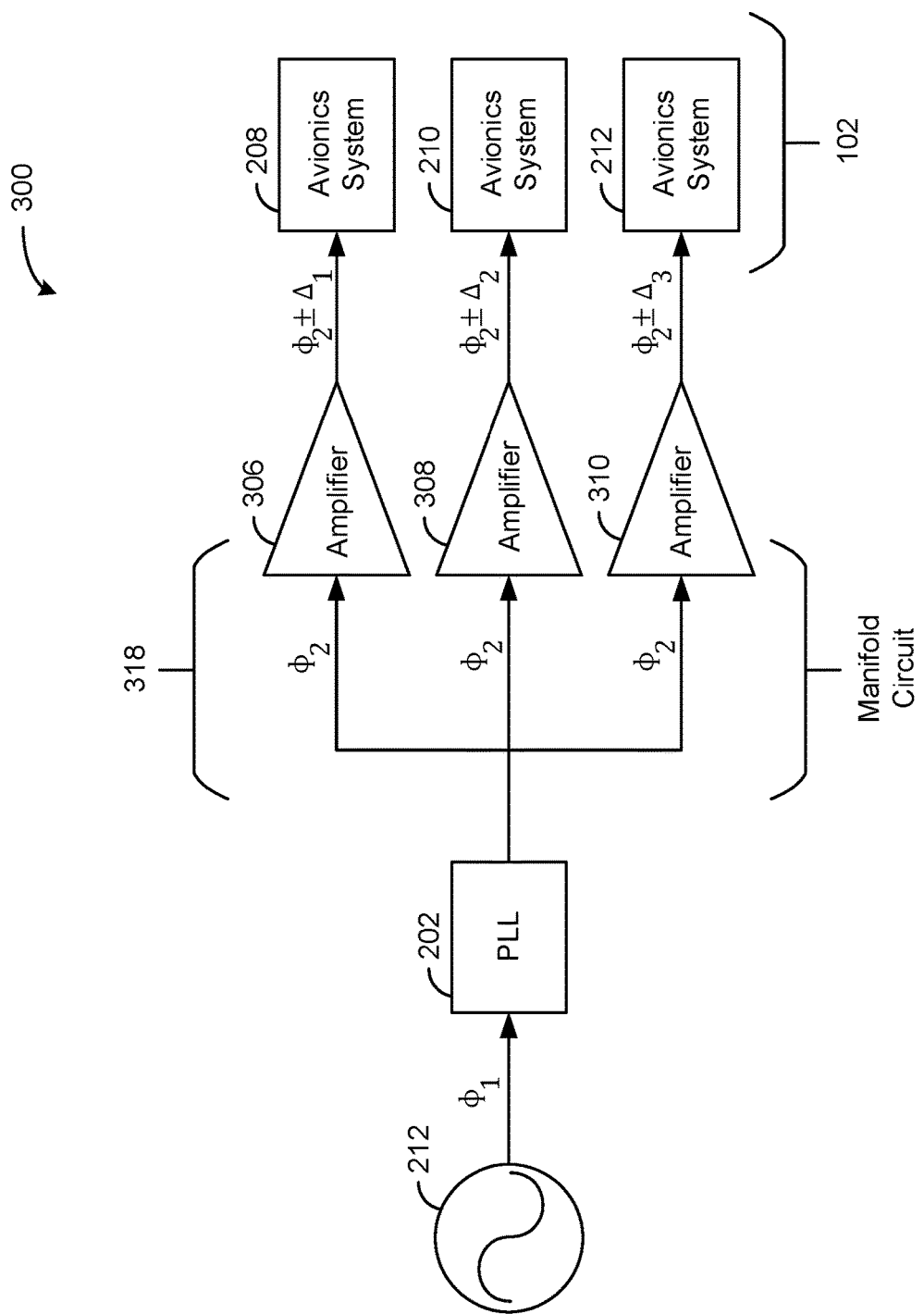
FIG. 3 is a circuit block diagram including a manifold circuit configured to provide a signal generated by a single PLL circuit to multiple avionics systems, according to exemplary aspects of the inventive concepts disclosed herein.

Referring now to FIG. 3, a circuit block diagram of a circuit 300 is shown including a manifold circuit 318 for providing a signal of a single PLL, the PLL 202, to the avionics systems 208-212 as described with reference to FIG. 2, according to an exemplary embodiment. The manifold circuit 318 can be implemented in the circuit 300 so that the output of one single PLL 202 can be provided to the avionics systems 208-212 so that the signals received by the avionics systems 208-212 are all in phase. This solution utilizes a single PLL instead of multiple PLLs and uses the manifold circuit 318 to provide the signal output of the PLL 202 to each of the avionics systems 208-212. However, as the frequency of the output of the PLL 202 increases, e.g., into the ultra-high frequency (UHF) (e.g., 300 MHz-3 GHz) band, extremely high frequency band (EHF) (e.g., 30 GHz-300 GHz), or any other frequency band, the signal strength of the output signal of the PLL 202 may decreases requiring the signals to be amplified. The manifold circuit 318 may require a large amount of gain and/or power to make up for the decrease in the signal strength. For this reason, amplifier circuits 306-310 can amplify the signals of the manifold circuit 318 before the signals are provided to the avionics systems 208-212.

The amplifiers 306-310 can compensate for the losses of the manifold circuit 318. However, each of the amplifiers 306-310 can generate a signal that may not be in phase with each other. As shown, signal generator 212 generates a signal with a phase $\phi_1$. The PLL 202 can generate a signal with a phase $\phi_2$ ($\phi_1$ in some cases) which is manifolded out to each of the amplifiers 306-310 via the manifold circuit 318. However, signal phase output of each amplifier may be different. The phase output of amplifier 306 may be $\phi_2 \pm \Delta_1$ while the output of amplifier 308 may be $\phi_2 \pm \Delta_2$ and the output of amplifier 310 may be $\phi_2 \pm \Delta_3$. Process, voltage, and temperature (PVT) may cause the deviation in phase and since the PVT of each of the amplifiers 306-310 may be different, the phase output of each amplifier is different. In this regard, the circuit 300 includes a similar issue to the circuit 200, i.e., each of the avionics systems 208-212 receives a signal with a different phase. Circuit 300 has poor phase alignment and utilizes excessive power for each of amplifiers 306-310 to overcome the line loss of the manifold circuit 318. Circuit 300 lacks a high frequency and/or highly parallel structure and does not have a phase aligned to an incoming reference signal.

Figure 4:
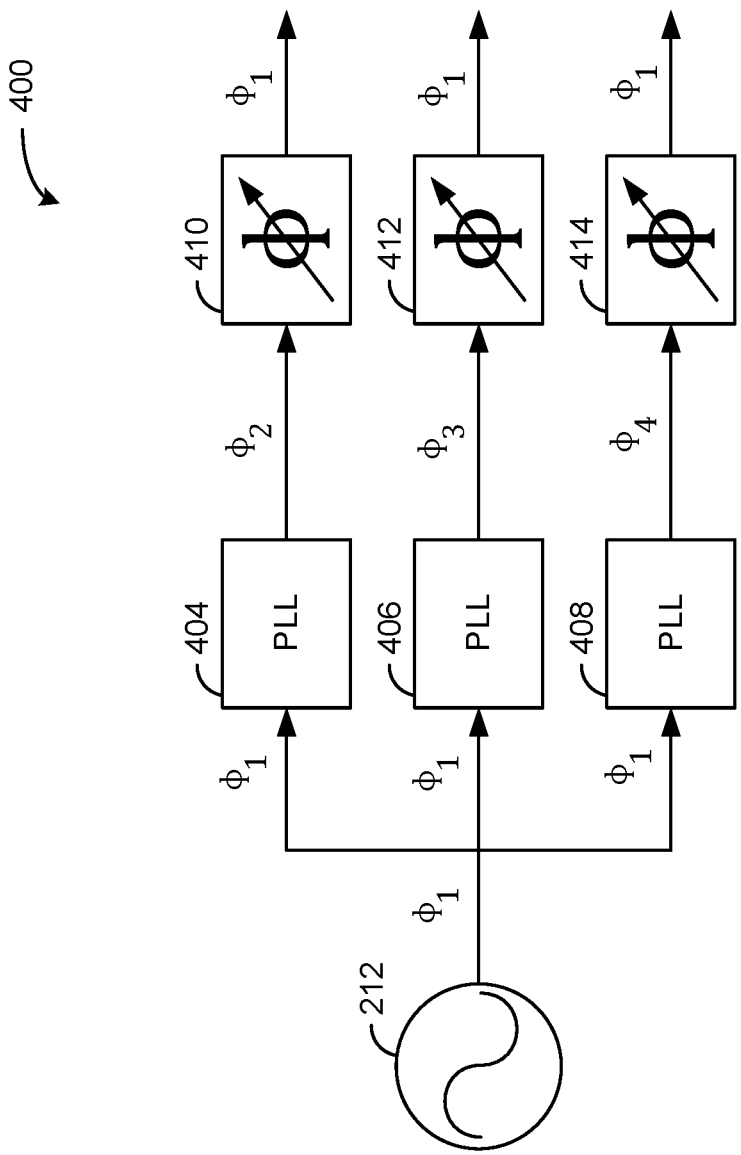
FIG. 4 is a circuit block diagram including multiple PLL circuits and multiple phase aligning circuits, each PLL circuit being paired with one of the phase aligning circuits such that each pair generates a signal in phase with signals generated by the other pairs, according to exemplary aspects of the inventive concepts disclosed herein.

Referring now to FIG. 4, a block diagram of a circuit 400 is shown including multiple PLLs 404-408 and multiple phase shifters 410-414, according to an exemplary embodiment. Since multiple PLLs are used instead of a single PLL and a manifold circuit, amplifiers are not required to compensate for line loss. Furthermore, since phase alignment circuits, i.e., the phase shifters 410-414 are used, the phase outputs of the circuit 400 are in phase with each other.

The signal generator 212 can be configured to generate a signal at a particular phase $\phi_1$, the signal being provided by the circuit 400 to each of the PLLs 404-408. Each of the PLLs 404-408 are configured to generate a signal with a particular phase and each of the phases may be different from each other and different from the phase of the signal generated by the signal generator 212, in some embodiments. The signal that each of the PLLs 404-408 are configured to generate have phases $\phi_2$, $\phi_3$, and $\phi_4$ respectively. However, each of the phase shifters 410-414 can be configured to align the output phases of the signals generated by the PLLs 404-408 with the signal generated by the signal generator 212. The signal output of each of the phase shifters 410-414 is $\phi_1$, the same phase as the signal generated by the signal generator 212. The circuit 400 can be utilized in high frequency systems, e.g., PESA and/or AESA since the signals are phase aligned and a manifold circuit and amplifiers is not required which would introduce phase differences between signals.

Figure 5:
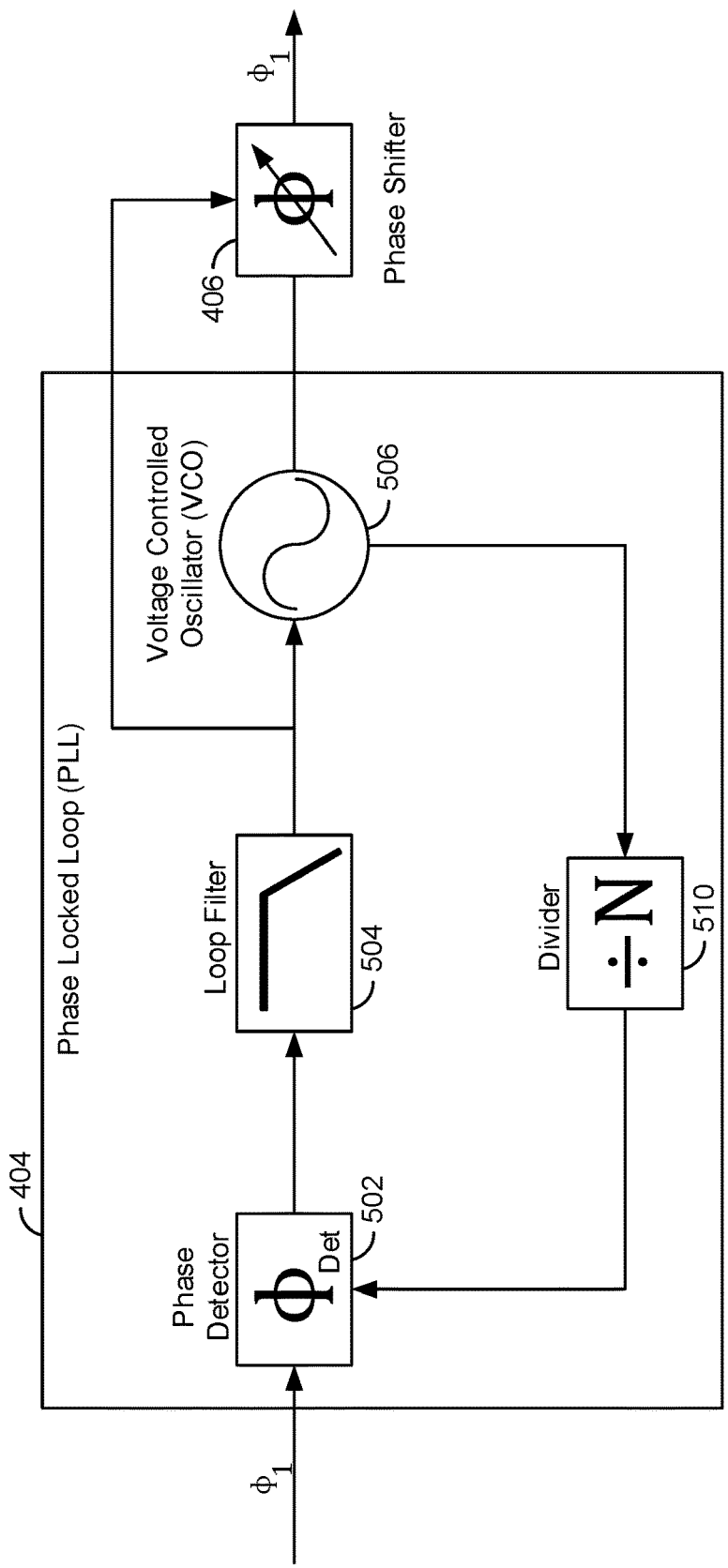
FIG. 5 is a circuit block diagram of one of the PLL circuits and one of the phase aligning circuits of FIG. 4 in greater detail, the phase aligning circuit phase aligning an output signal of the PLL with an input signal of the PLL, according to exemplary aspects of the inventive concepts disclosed herein.

Referring now to FIG. 5, the PLL 404 and the phase shifter 406 of FIG. 4 are shown in greater detail, according to an exemplary embodiment. The PLL 404 can be any kind of PLL, e.g., an Analog Devices ADF 4356. PLL 404 is shown to include a phase detector 502. The phase detector 502 can be a Type I or a Type II phase detector. The phase detector 502 may be an XOR logic gate configured to perform an exclusive-or comparison of the input signal and the output signal and provide the resulting comparison signal to loop filter 504 and/or a diode ring mixer phase detector. The phase detector 502 can be a phase-frequency detector that can be configured to be an edge triggered JK flip flop and/or a dual D type phase comparator. The output of phase detector 502 may be a signal with a voltage, the value of the signal indicating the phase difference of the input signal and the output signal.

Loop filter 504 can be configured to filter the output signal of the phase detector 502. Loop filter 502 may be outside, or integrated within, a single chip including the PLL 404 and/or the phase shifter 406. For example, the output signal of phase detector 502 may be a digital square wave with a particular duty cycle, the duty cycle proportional to the phase difference of the signals input to the phase detector 502. However, the loop filter 504 can be configured to perform a low pass filter to remove the high frequency components of the digital square wave to generate a constant (or quasi-constant, with voltage ripple) voltage signal. The loop filter 504 can be active (e.g., operational amplifier based) and/or passive (e.g., resistor-capacitor (RC) based or resistor, inductor, capacitor (RLC) based). The characteristics of the loop filter 504 can define the performance of the PLL 404 and can adjust how quickly voltage controlled oscillator (VCO) 506 responds to changes in phase between the output signal and the input signal.

VCO 506 can be configured to receive the signal generated by the phase detector 502 and filtered by the loop filter 504 and can be configured to generate an output signal based on the filtered signal. The VCO 506 can be configured to generate a signal at a frequency proportional to or otherwise a function of, a voltage level of the filtered signal. VCO 506 can be any type of voltage controlled oscillator and can be a linear or harmonic oscillator and/or a relaxation oscillator. The VCO 506 can be a crystal oscillator, a ceramic oscillator, an operational amplifier and a resonator, etc.

The signal generated by the VCO 506 can be provided to the phase shifter 406 and also fed back into the phase detector 502 for controlling the PLL 404. The PLL 404 includes a divider circuit 510. The divider circuit can be an optional component. The divider circuit 510 may be configured to divide the frequency of the signal generated by the VCO 506. This divided frequency signal can be provided to the phase detector 502. Dividing the frequency of the output signal can cause the VCO 506 to increase the output frequency relative to the input signal of the PLL 404. In this regard, frequency multiplication by a particular integer, e.g., N, can be implemented in the PLL 404.

The phase shifter 406 can be a phase alignment circuit configured to align the output of the VCO 506 with the input to the PLL 404. Phase shifter 406 can be configured to shift the phase of the signal generated by the VCO 506 as a function of the signal of the phase detector 502 filtered by the loop filter 504. The phase shifter 406 may be a high precision AESA phase shifter. The phase shifter 406 can be a Monolithic Dual-Gate GaAs FET Digital Phase Shifter, e.g., the phase shifter describe in Vorhaus, J. L. et al, "*Monolithic Dual-Gate GaAs FET Digital Phase Shifter*", *IEEE transactions on Microwave Theory and Techniques*, Vol. MTT-30, No. 7, July 1982, the entirety of which is incorporated by reference herein. Furthermore, the phase shifter 406 can be any type of active or passive radio frequency phase shifting circuit, component module, software program implemented on a digital circuit or processing circuit, etc.

The difference in phase, represented by the filtered signal of the loop filter 504, can be used as a control signal for the phase shifter 406. In this regard, the phase shifter 406 can be configured to shift the phase of the signal of the VCO 506 in an amount, e.g., as a function of the filtered signal generated by the phase detector 502. This correction of phase caused by the shifting of the VCO signal can cause the input signal to the PLL 404 to be at the same phase as the output of the phase shifter 406.

Figure 6:
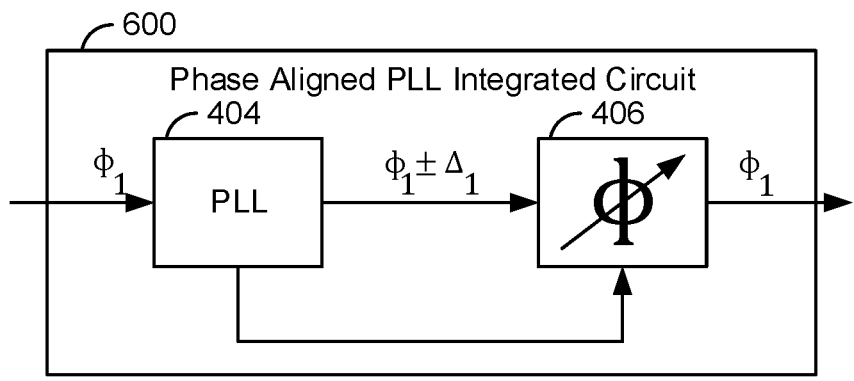
FIG. 6 is an integrated circuit block diagram including both a PLL circuit and a phase aligning circuit, according to exemplary aspects of the inventive concepts disclosed herein.
Figure 7:
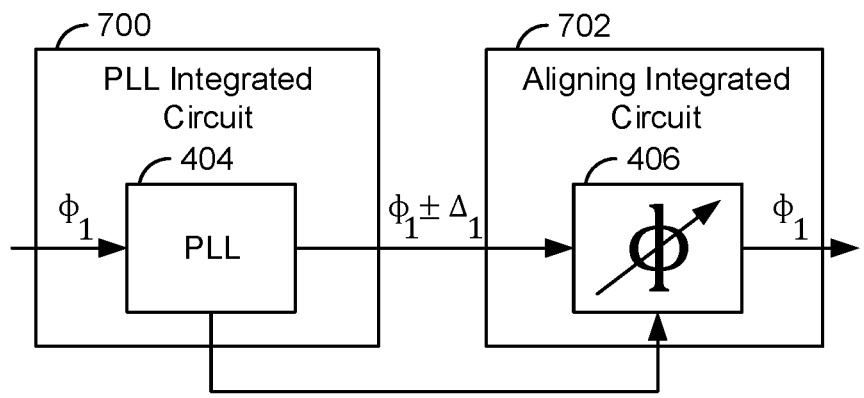
FIG. 7 is an integrated circuit block diagram including an integrated circuit including a PLL circuit connected to another integrated circuit including a phase aligning circuit, according to exemplary aspects of the inventive concepts disclosed herein.

Referring now to FIGS. 6-7, integrated circuits are shown including the PLL 404 and the phase shifter 406 in a single integrated circuit and in separate integrated circuits, according to exemplary embodiments. In FIG. 6, the PLL 404 and the phase detector 406 are shown to be included in a single phase aligned PLL integrated circuit 600. Combining the PLL 404 into a single integrated circuit package with the phase detector 406 can allow for easy installation of a phase aligned PLL into a circuit system, i.e., only one integrated circuit component needs to be integrated into the circuit system.

In FIG. 7, a PLL integrated circuit 700 is shown to include the PLL 404 while an aligning integrated circuit 702 is shown including the phase shifter 406. In this regard, two separate integrated circuits can be integrated into a circuit to enable the output of the PLL 404 to be phase aligned to an input of the PLL 404. In some embodiments, separating the integrated circuits may be useful, for example, when an existing system is utilizing a PLL, e.g., the PLL integrated circuit 700, and phase alignment is required. In such a circumstance, only the aligning integrated circuit 702 may need to be installed to implement phase alignment.

Figure 8:
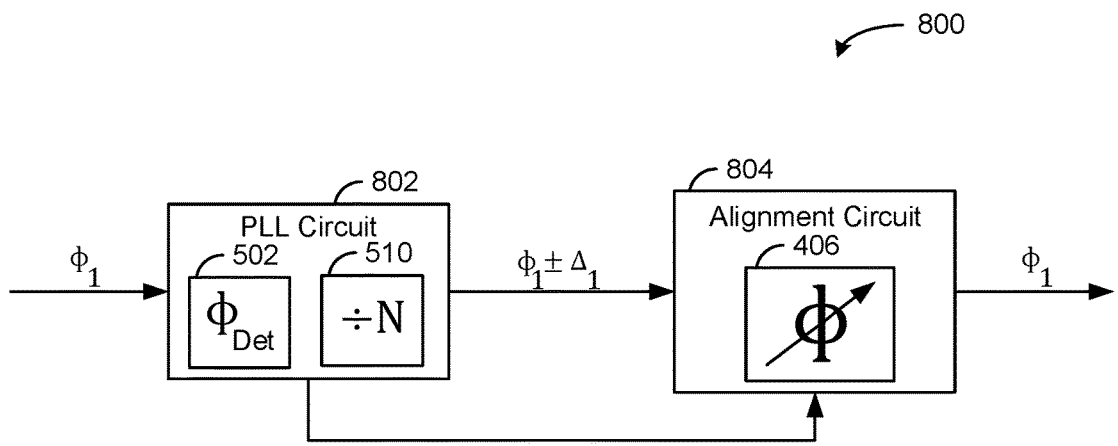
FIG. 8 is a circuit block diagram of a PLL circuit including a phase detector and a frequency divider and an alignment circuit including a phase shifter, the alignment circuit aligning a signal phase of a signal of the PLL circuit based on the phase shifter of the alignment circuit, the phase detector of the PLL circuit, and the frequency divider of the PLL circuit, according to exemplary aspects of the inventive concepts disclosed herein.
Figure 9:
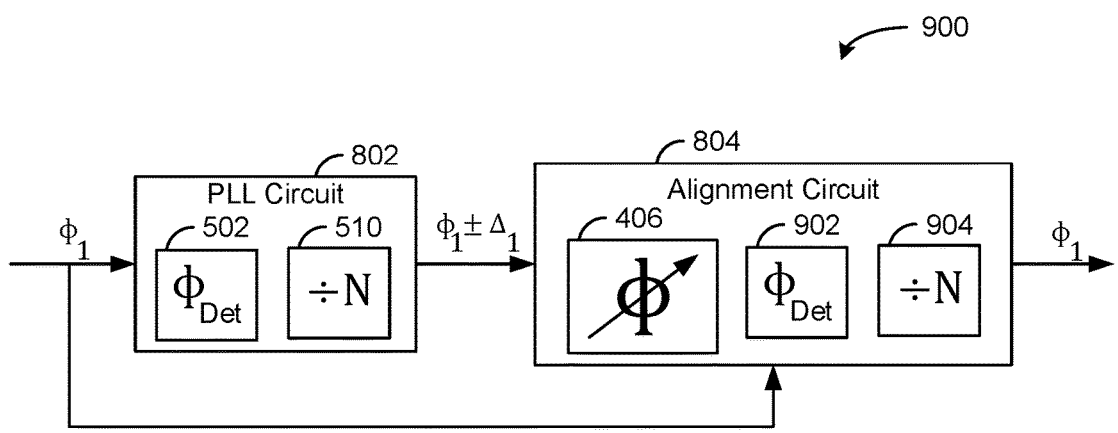
FIG. 9 is a circuit block diagram of a PLL circuit including a phase detector and a frequency divider and an alignment circuit including a phase shifter, a phase detector, and a frequency divider, the alignment circuit aligning a signal phase of a signal of the PLL circuit based on the phase shifter, the phase detector, and the frequency divider of the alignment circuit, according to exemplary aspects of the inventive concepts disclosed herein.

Referring now to FIGS. 8-9, circuits 800 and 900 are shown illustrating reused or multiple phase detectors and/or frequency dividers, according to exemplary embodiments. In FIG. 8, the PLL circuit 802, which may be the same as or similar to the PLL 404 as described with reference to FIG. 5, is shown to include the phase detector 502 and the divider circuit. Alignment circuit 804, including phase shifter 406, can be configured to align the phase output of the alignment circuit 808 with the phase input to the PLL circuit 802. Reusing the phase detector 502 and the frequency divider 510 instead of adding additional phase detectors and frequency dividers can realize higher accuracy phase shifting and/or can result in lower circuit fabrication costs.

Circuit 800 may be useful when the components of PLL circuit 802 (e.g., electrical connections to) are accessible and can be connected to alignment circuit 804. However, in some embodiments, PLL circuit 802 could be a single integrated circuit where no connection between a loop filter and a VCO of the PLL is available to be connected to the alignment circuit 804 and used as a control for the phase shifter 406. In this regard, the circuit of FIG. 9 can be implemented when these control connections are unavailable.

In FIG. 9, the alignment circuit 804 is shown to include its own detector circuit 902 and divider 904. Phase detector 902 can be the same as or similar to the phase detector 502 and the frequency divider 904 may be the same as or similar to the divider 510. In this regard, the alignment circuit 804 can receive the same input as the PLL circuit 802 and can utilize the input, the detector circuit 902, and the divider 904 to control the operation of the phase shifter 406 to shift the output of the PLL circuit 802 to be aligned with the input signal of the PLL circuit 802.

Figure 10:
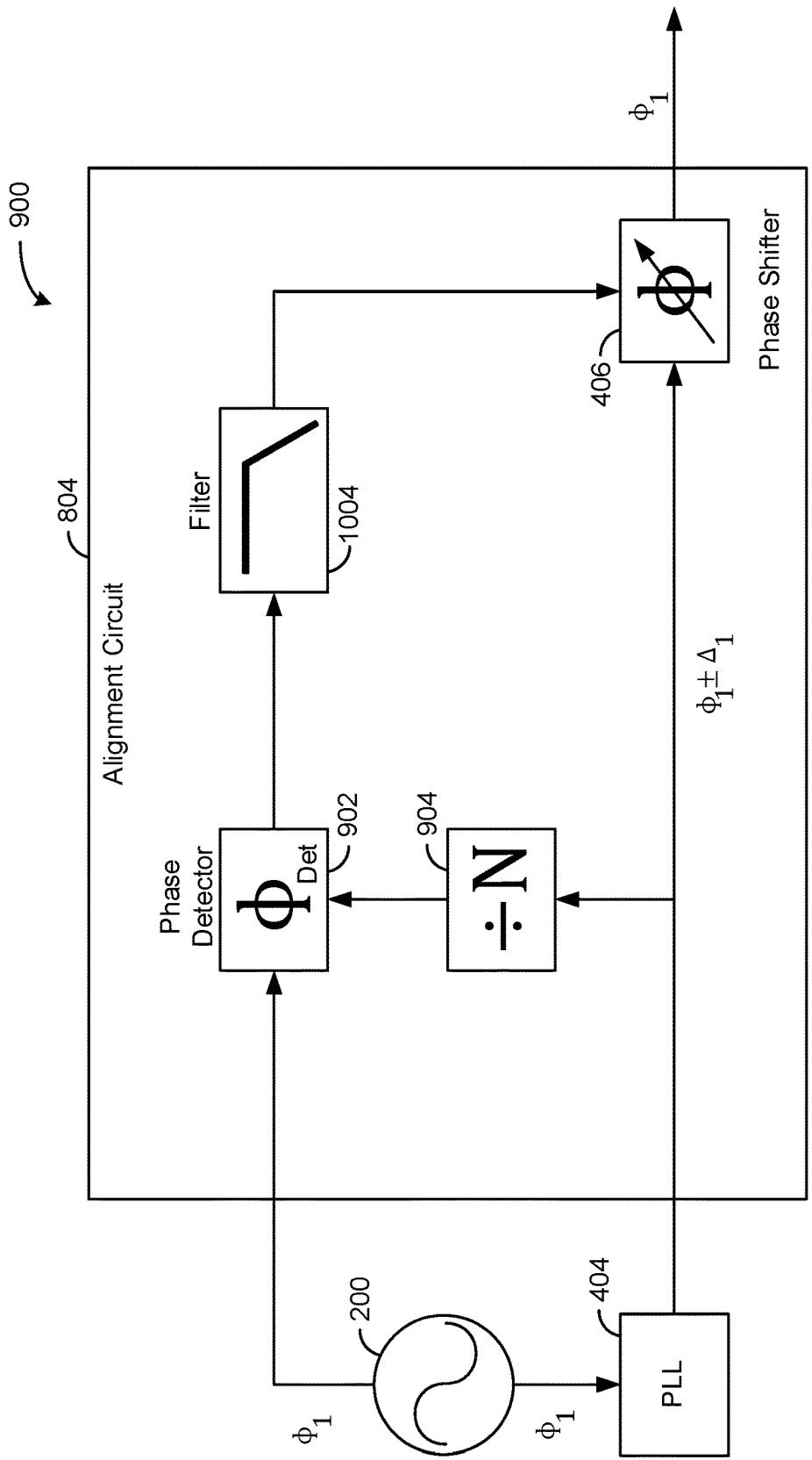
FIG. 10 is the circuit block diagram of FIG. 9 shown in greater detail, according to exemplary aspects of the inventive concepts disclosed herein.

Referring now to FIG. 10, the circuit block diagram 900 of FIG. 9 is shown in greater detail, according to an exemplary embodiment. The alignment circuit 804 further includes a loop filter 1004 that may be the same as and/or similar to the loop filter 504 as described with reference to FIG. 5. The alignment circuit 804 may divide the frequency of the signal generated by the PLL 404 can provide the divided signal to the phase detector 902. The phase detector 902 can be configured to compare the phase of the frequency divided signal to the phase of the signal generated by the signal generator 212 to generate a control signal. The control signal can be filtered by the filter 1004 and provided to the phase shifter 406. The filtered control signal can be configured to cause the phase shifter 406 to shift the phase of the signal generated by the PLL 404 to be phase aligned with the signal generated by the signal generator. In some embodiments, the divider 904 may be configured to divide by the same integer as the divider 510. The filter 1004 may have the same and/or different characteristics as the loop filter 504.

The scope of this disclosure should be determined by the claims, their legal equivalents and the fact that it fully encompasses other embodiments which may become apparent to those skilled in the art. All structural, electrical and functional equivalents to the elements of the above-described disclosure that are known to those of ordinary skill in the art are expressly incorporated herein by reference and are intended to be encompassed by the present claims. A reference to an element in the singular is not intended to mean one and only one, unless explicitly so stated, but rather it should be construed to mean at least one. No claim element herein is to be construed under the provisions of 35 U.S.C. § 112, sixth paragraph, unless the element is expressly recited using the phrase "means for." Furthermore, no element, component or method step in the present disclosure is intended to be dedicated to the public, regardless of whether the element, component or method step is explicitly recited in the claims.

Embodiments of the inventive concepts disclosed herein have been described with reference to drawings. The drawings illustrate certain details of specific embodiments that implement the systems and methods and programs of the present disclosure. However, describing the embodiments with drawings should not be construed as imposing any limitations that may be present in the drawings. The present disclosure contemplates methods, systems and program products on any machine-readable media for accomplishing its operations. Embodiments of the inventive concepts disclosed herein may be implemented using an existing computer processor, or by a special purpose computer processor incorporated for this or another purpose or by a hardwired system.

Embodiments in the inventive concepts disclosed herein have been described in the general context of method steps which may be implemented in one embodiment by a program product including machine-executable instructions, such as program code, for example in the form of program modules executed by machines in networked environments. Generally, program modules include routines, programs, objects, components, data structures, etc. that perform particular tasks or implement particular abstract data types. Machine-executable instructions, associated data structures, and program modules represent examples of program code for executing steps of the methods disclosed herein. The particular sequence of such executable instructions or associated data structures represent examples of corresponding acts for implementing the functions described in such steps.

It should be noted that although the diagrams herein may show a specific order and composition of method steps, it is understood that the order of these steps may differ from what is depicted. For example, two or more steps may be performed concurrently or with partial concurrence. Also, some method steps that are performed as discrete steps may be combined, steps being performed as a combined step may be separated into discrete steps, the sequence of certain processes may be reversed or otherwise varied, and the nature or number of discrete processes may be altered or varied. The order or sequence of any element or apparatus may be varied or substituted according to alternative embodiments. Accordingly, all such modifications are intended to be included within the scope of the present disclosure.

The foregoing description of embodiments has been presented for purposes of illustration and description. It is not intended to be exhaustive or to limit the subject matter to the precise form disclosed, and modifications and variations are possible in light of the above teachings or may be acquired from practice of the subject matter disclosed herein. The embodiments were chosen and described in order to explain the principals of the disclosed subject matter and its practical application to enable one skilled in the art to utilize the disclosed subject matter in various embodiments and with various modifications as are suited to the particular use contemplated. Other substitutions, modifications, changes and omissions may be made in the design, operating conditions and arrangement of the embodiments without departing from the scope of the presently disclosed subject matter.

What is claimed is:

1. A signal phase aligning system, the system comprising:
a signal generator configured to generate a signal;
a phase locked loop circuit configured to generate a phase locked loop signal based on the signal generated by the signal generator, wherein the phase locked loop circuit comprises:
  a phase detector circuit configured to generate a voltage signal, wherein a value of the voltage signal is based on a relative difference in phase between the phase locked loop signal and the signal generated by the signal generator;
  a loop filter configured to receive the voltage signal of the phase detector circuit as an input and generate a filtered signal as a loop filter output based on the voltage signal; and
  a voltage controlled oscillator, wherein the voltage controlled oscillator is configured to generate the phase locked loop signal at a frequency proportional to a voltage of the filtered signal, the phase locked loop signal generated as a voltage controlled oscillator output of the voltage controlled oscillator; and
a phase aligning circuit configured to align a phase locked loop signal phase of the phase locked loop signal with a signal phase of the signal generated by the signal generator, wherein the phase aligning circuit is configured to receive a control input, wherein the phase aligning circuit receives the filtered signal as the control input, wherein the phase aligning circuit is configured to shift the phase locked loop signal phase of the phase locked loop signal based on the control input, wherein the phase aligning circuit comprises a phase shifter configured to generate a shifted signal as a phase shifter output based on the phase locked loop signal output by the voltage controlled oscillator, wherein the voltage controlled oscillator output of the voltage controlled oscillator and the loop filter output of the loop filter are both inputs to the phase shifter.

2. The system of claim 1, further comprising:
a second phase locked loop circuit configured to generate a second phase locked loop signal based on the signal generated by the signal generator; and
a second phase aligning circuit configured to align a second phase locked loop signal phase of the second phase locked loop signal with the signal phase of the signal generated by the signal generator;
wherein the phase locked loop signal phase of the phase locked loop signal and the second phase locked loop signal phase of the second phase locked loop signal are aligned by the phase aligning circuit and the second phase aligning circuit.

3. The system of claim 1, the phase shifter is configured to shift the phase locked loop signal phase of the phase locked loop signal to the signal phase of the signal generated by the signal generator.

4. The system of claim 1, wherein the phase locked loop circuit and the phase aligning circuit are combined in a single integrated circuit.

5. The system of claim 1, wherein the phase locked loop circuit comprises a frequency divider circuit, wherein the phase locked loop circuit generates the phase locked loop signal based on the frequency divider circuit.

6. The system of claim 1, further comprising a plurality of other phase aligning circuits each configured to generate one of a plurality of other shifted signals based on a plurality of phase locked loop signals generated by a plurality of other phase locked loop circuits based on the signal, wherein the shifted signal, the plurality of other shifted signals, and the signal are all in phase.

7. The system of claim 6, wherein the shifted signal and the plurality of other shifted signals are inputs to one or more avionics systems of an aircraft.

8. The system of claim 7, wherein the one or more avionics systems comprise a plurality of circuits of a phased array system of the aircraft, wherein the plurality of circuits are configured to transmit or receive phased array signals based on the shifted signal and the plurality of other shifted signals, wherein each of the plurality of circuits receives one of the shifted signal and the plurality of other shifted signals.

9. A signal phase aligning circuit, the circuit comprising:
a signal generator circuit configured to generate a signal;
a phase locked loop circuit configured to generate a phase locked loop signal based on the signal generated by the signal generator circuit, wherein the phase locked loop circuit comprises a phase detector, a loop filter, and a voltage controlled oscillator, wherein the voltage controlled oscillator is configured to generate the phase locked loop signal at a frequency proportional to a voltage of a filtered signal generated by the phase detector and filtered by the loop filter, wherein the phase detector is configured to generate a phase detector signal as a difference in phase between the phase locked loop signal and the signal generated by the signal generator circuit, wherein the loop filter is configured to generate the filtered signal based on the phase detector signal by filtering the phase detector signal; and
a phase aligning circuit configured to receive a control input and align a phase locked loop signal phase of the phase locked loop signal with a signal phase of the signal generated by the signal generator circuit based on the control input, wherein the control input is the filtered signal, wherein the phase aligning circuit is a phase shifter, wherein the phase aligning circuit is configured to generate a shifted signal as a phase aligning circuit output based on the phase locked loop signal output by the voltage controlled oscillator, wherein a voltage controlled oscillator output of the voltage controlled oscillator and a loop filter output of the loop filter are both inputs to the phase aligning circuit.

10. The circuit of claim 9, further comprising:
a second phase locked loop circuit configured to generate a second phase locked loop signal based on the signal generated by the signal generator circuit; and
a second phase aligning circuit configured to align a second phase locked loop signal phase of the second phase locked loop signal with the signal phase of the signal generated by the signal generator circuit;
wherein the phase locked loop signal phase of the phase locked loop signal and the second phase locked loop signal phase of the second phase locked loop signal are aligned by the phase aligning circuit and the second phase aligning circuit.

11. The circuit of claim 9, wherein the phase shifter is configured to shift the phase locked loop signal phase of the phase locked loop signal to the signal phase of the signal generated by the signal generator circuit.

12. The circuit of claim 9, wherein the phase locked loop circuit comprises a frequency divider circuit, wherein the phase locked loop circuit generates the phase locked loop signal based on the frequency divider circuit.

13. The circuit of claim 9, wherein the phase locked loop circuit and the phase aligning circuit are each a separate integrated circuit.

14. The circuit of claim 9, wherein the shifted signal is an avionics system input to one or more avionics systems of an aircraft.

15. The circuit of claim 14, wherein the one or more avionics systems comprise one or more circuits of a phased array system of the aircraft, wherein the one or more circuits of the phased array system transmit or receive phased array signals based on the shifted signal.

16. An integrated circuit, the integrated circuit comprising:
a first phase locked loop circuit configured to generate a first phase locked loop signal based on a signal generated by a signal generator, wherein the first phase locked loop circuit comprises:
a phase detector circuit configured to generate a voltage signal wherein a value of the voltage signal is based on a relative difference in phase between the first phase locked loop signal and the signal generated by the signal generator;
a loop filter configured to receive the voltage signal of the phase detector circuit as an input and generate a filtered signal as a loop filter output based on the voltage signal; and
a voltage controlled oscillator, wherein the voltage controlled oscillator is configured to generate the first phase locked loop signal at a frequency proportional to a voltage of the filtered signal, the first phase locked loop signal generated as a voltage controlled oscillator output of the voltage controlled oscillator;
a first phase aligning circuit configured to align a first phase locked loop signal phase of the first phase locked loop signal with a signal phase of the signal generated by the signal generator, wherein the first phase aligning circuit receives a control input, wherein the first phase aligning circuit receives the filtered signal as the control input, wherein the first phase aligning circuit is configured to shift the first phase locked loop signal phase of the first phase locked loop signal based on the control input, wherein the first phase aligning circuit comprises a phase shifter, wherein the phase shifter is configured to generate a shifted signal as a phase shifter output based on the phase locked loop signal output by the voltage controlled oscillator, wherein the voltage controlled oscillator output of the voltage controlled oscillator and the loop filter output of the loop filter are both inputs to the phase shifter;
a second phase locked loop circuit configured to generate a second phase locked loop signal based on the signal generated by the signal generator; and
a second phase aligning circuit configured to align a second phase locked loop signal phase of the second phase locked loop signal with the signal phase of the signal of the signal generator;
wherein the first phase locked loop signal phase of the first phase locked loop signal is aligned with the second phase locked loop signal phase of the second phase locked loop signal.

17. The integrated circuit of claim 16, wherein the phase shifter is configured to shift the first phase locked loop signal phase of the first phase locked loop signal to the signal phase of the signal of the signal generator, aligning the first phase locked loop signal phase of the first phase locked loop signal with the signal phase of the signal of the signal generator.

18. The integrated circuit of claim 16, wherein the second phase aligning circuit receives a second control input, wherein the second phase aligning circuit is configured to shift the second phase locked loop signal phase of the second phase locked loop signal based on the second control input;
wherein the second phase locked loop circuit comprises:
a second phase detector circuit configured to generate a second voltage signal, wherein the second voltage signal is proportional to a second difference in phase between the second phase locked loop signal and the signal generated by the signal generator; and
a second loop filter configured to receive the second voltage signal of the second phase detector circuit as a second input and generate a second filtered signal as a second loop filter output based on the second voltage signal;
wherein the second phase aligning circuit receives the second filtered signal as the second control input.

19. The integrated circuit of claim 16, wherein the first phase locked loop signal and the second phase locked loop signal are avionics system inputs to one or more avionics systems of an aircraft.

20. The integrated circuit of claim 19, wherein the one or more avionics systems comprise one or more circuits of a phased array system of the aircraft, wherein the one or more circuits of the phased array system transmit or receive phased array signals based on the first phase locked loop signal.

* * * * *